(12) United States Patent
Ahmed et al.

(10) Patent No.: US 7,414,298 B2
(45) Date of Patent: *Aug. 19, 2008

(54) SUPER SELF-ALIGNED COLLECTOR DEVICE FOR MONO-AND HETERO BIPOLAR JUNCTION TRANSISTORS, AND METHOD OF MAKING SAME

(75) Inventors: Shahriar Ahmed, Portland, OR (US); Mark Bohr, Aloha, OR (US); Stephen Chambers, Portland, OR (US); Richard Green, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/633,055

(22) Filed: Jul. 31, 2003

(65) Prior Publication Data
US 2004/0021206 A1    Feb. 5, 2004

Related U.S. Application Data

(63) Continuation of application No. 10/013,075, filed on Dec. 10, 2001, now Pat. No. 6,703,685.

(51) Int. Cl.
*H01L 29/06* (2006.01)
(52) U.S. Cl. .................. 257/565; 257/584; 257/581; 257/561; 257/560; 257/563; 257/577; 257/578; 257/510; 257/273; 257/197; 257/E21.375; 257/E21.37; 257/E21.387; 438/235; 438/309; 438/312

(58) Field of Classification Search ............ 257/584, 257/581, 561, 560, 563, 577, 578, 510, 565, 257/273, 197, E21.375, E21.37, E21.387; 438/235, 309, 312
See application file for complete search history.

(56) References Cited

U.S. PATENT DOCUMENTS 4,957,875 A    9/1990    Akbar et al.

(Continued)

FOREIGN PATENT DOCUMENTS

EP    0 354 153 A2    2/1990

(Continued)

OTHER PUBLICATIONS

W. Liu, et al., "Novel Doubly Self-Aligned AlGaAs/GaAs HBT," Abstract, Electronic Letters, IEE Stevenage, GB, vol. 26, No. 17 Aug. 16, 1990 2 pages.

(Continued)

*Primary Examiner*—Lynne A. Gurley
*Assistant Examiner*—Junghwa Im
(74) *Attorney, Agent, or Firm*—Blakely, Sokoloff, Taylor & Zafman LLP (57) ABSTRACT

The invention relates to a process of forming a compact bipolar junction transistor (BJT) that includes forming a self-aligned collector tap adjacent the emitter stack and an isolation structure. A base layer is formed from epitaxial silicon that is disposed in the substrate.

12 Claims, 7 Drawing Sheets

U.S. PATENT DOCUMENTS

| | | | |
|---|---|---|---|
| 5,024,957 A * | 6/1991 | Harame et al. | 438/367 |
| 5,064,772 A | 11/1991 | Jambotkar | |
| 5,087,580 A * | 2/1992 | Eklund | 438/155 |
| 6,232,638 B1 | 5/2001 | Suzuki | |
| 6,365,479 B1 | 4/2002 | U'Ren | |
| 6,476,452 B2 | 11/2002 | Suzuki | |
| 6,703,685 B2 * | 3/2004 | Ahmed et al. | 257/565 |

FOREIGN PATENT DOCUMENTS

| | | |
|---|---|---|
| EP | 0 468 271 A1 | 1/1992 |
| EP | 0 476 380 A1 | 3/1992 |
| EP | 0 779 663 A2 | 6/1997 |
| JP | 61085864 | 1/1986 |

OTHER PUBLICATIONS

PCT Search Report dated Sep. 12, 2003, 7 pages.

* cited by examiner

SUPER SELF-ALIGNED COLLECTOR DEVICE FOR MONO-AND HETERO BIPOLAR JUNCTION TRANSISTORS, AND METHOD OF MAKING SAME

This is a Continuation Application of Ser. No.: 10/013,075 filed Dec. 10, 2001 now U.S. Pat. No. 6,703,685, which is presently pending.

BACKGROUND OF THE INVENTION

1. Field of the Invention

The present invention relates generally to integrated circuit fabrication, and, more specifically, the present invention relates to the fabrication of a super self-aligned collector for a bipolar junction transistor device design and process flow that allows for a compact bipolar junction transistor layout.

2. Description of Related Art

A bipolar junction transistor (BJT) exhibits significant resistance and substrate capacitance that raise performance issues. In high-performance bipolar complementary metal oxide semiconductor (BiCMOS) processing the process flow needs to be integrated. The addition of high energy, high dose implantation, the use of a heavily doped substrate layer, and the use of high temperature cycles all significantly degrade CMOS performance. Independent optimization of the deep collector plug (DCP) implant and the buried layer (BL) is difficult especially in the presence of CMOS devices.

Figure 9:
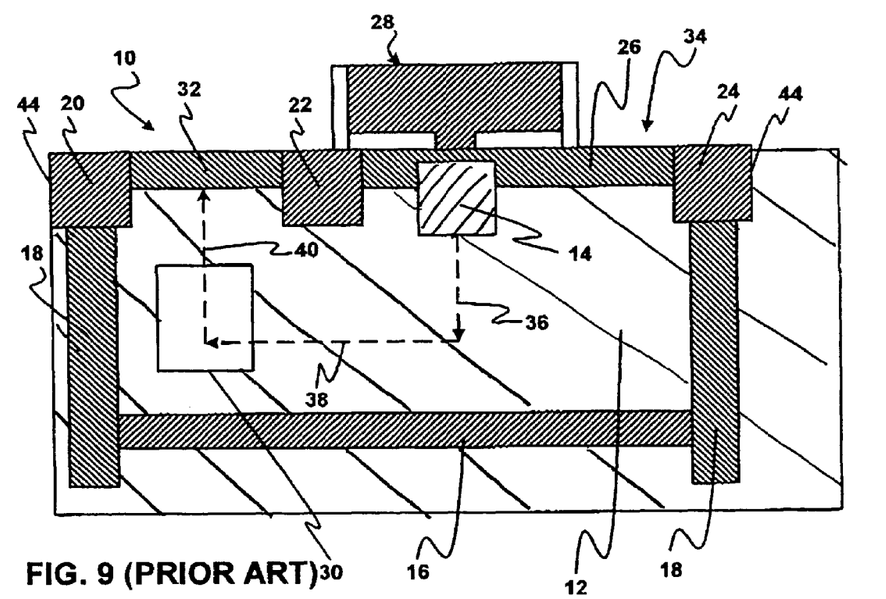
FIG. 9 is an elevational cross-section of a semiconductor structure according to present technique.

FIG. 9 illustrates an existing BJT 10. The BJT 10 includes a substrate 12, a collector structure 14 disposed in substrate 12, a buried layer 16, and deep trench isolation (DTI) structures 18. BJT 10 also includes shallow trench isolation (STI) structures that include a collector-proximate STI (collector STI) 20, a middle- or emitter-proximate STI (emitter STI) 22, and a base-proximate STI (base STI) 24. Upon substrate 12, an epitaxial layer 26 is formed. An emitter stack 28 is disposed above the epitaxial layer 26. Additionally, a deep collector plug 30, a collector tap 32 and a base tap region 34 are part of BJT 10.

Total resistivity from the collector structure to the collector tap in a BJT has a significant effect on performance. In FIG. 9, three significant resistivity paths exist. Although each path is depicted schematically by a dashed line, it is understood that the resistivity paths are actually located in 3-dimensional solid space in substrate 12 that is approximated by the dashed lines. A downward vertical first resistivity path 36 passes from collector structure 14 into substrate 12 toward buried layer 16. First resistivity path 36 may amount to about 10% of the total resistivity between collector structure 14 and collector tap 32. A horizontal second resistivity path 38 passes from first resistivity path 36, under emitter STI 22 and toward deep collector plug 30. Second resistivity path 38 may amount to about 30% of the total resistivity between collector structure 14 and collector tap 32. An upward vertical third resistivity path 40 passes from second resistivity path 38 into collector plug 30. Third resistivity path 40 may amount to about 60% of the total resistivity between collector structure 14 and collector tap 32. For example first resistivity path 36 represents a range from about 300 ohm·cm$^{-2}$ to about 700 ohm·cm$^{-2}$, second resistivity path 38 represents a range from about 1,300 ohm·cm$^{-2}$ to about 1,700 ohm·cm$^{-2}$, and third resistivity path 40 represents a range from about 2,750 ohm·cm$^{-2}$ to about 3,250 ohm·cm$^{-2}$.

Direction changes in current flow also affect efficiency. Accordingly, because of the downward first, horizontal second, and upward third resistivity paths, efficient current flow also is detrimentally affected due to directional changes.

Figure 10:
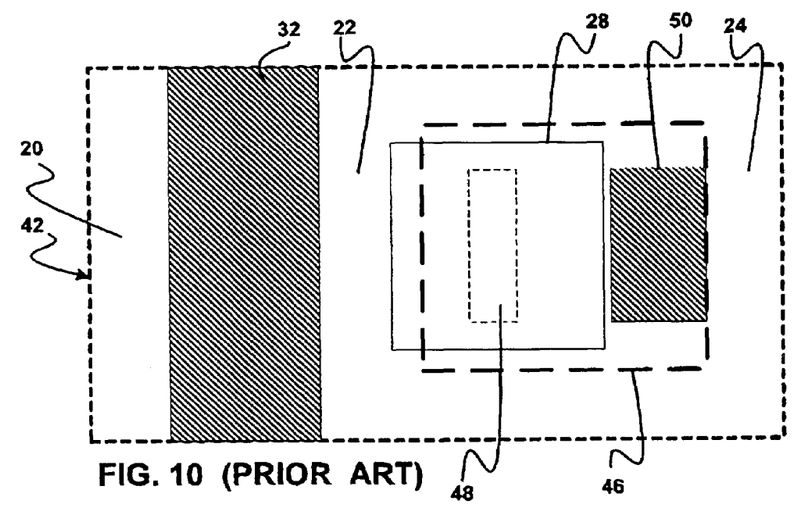
FIG. 10 is a plan view of a prior art BJT layout wherein the perimeters of various structures are depicted.

FIG. 10 is a top layout schematic view depicting selected structures of BJT 10 without depicting elevational differences. A BJT perimeter 42 measures the BJT 10 from the outer edges 44 (FIG. 9) of collector STI 20 and base STI 24. Emitter STI 22 and base STI 24 are part of a guard ring that is encompassed by BJT perimeter 42. An exptaxial base layer perimeter 46 is also depicted that relates to epitaxial base layer 26 in FIG. 9. Emitter stack 28 is depicted by its perimeter, and an intrinsic base region 48, is also depicted by its perimeter as it forms substantially above collector structure 14. Other selected structures include collector tap 32 and a base tap 50 portion of epitaxial layer 26 that is located within epitaxial base layer perimeter 46. It is noted that current flows through substrate, beneath emitter STI 22.

BRIEF DESCRIPTION OF THE DRAWINGS

In order to further illustrate the manner in which the embodiments of the invention are obtained, a more particular description of the invention briefly described above will be rendered by reference to specific embodiments thereof which are illustrated in the appended drawings. Understanding that these drawings depict only typical embodiments of the invention that are not necessarily drawn to scale and are not therefore to be considered to be limiting of its scope, the invention will be described and explained with additional specificity and detail through the use of the accompanying drawings in which.

DETAILED DESCRIPTION OF THE INVENTION

The present invention relates to a process of forming a bipolar junction transistor (BJT) that has a compact, super self-aligned collector (SAC) layout. Embodiments of the present invention include both monojunction and heterojunction BJT devices. A monojunction BJT is made with materials that all have the same semiconductive band gap. A heterojunction BJT is made with materials that all have different semiconductive band gaps.

Figure 1:
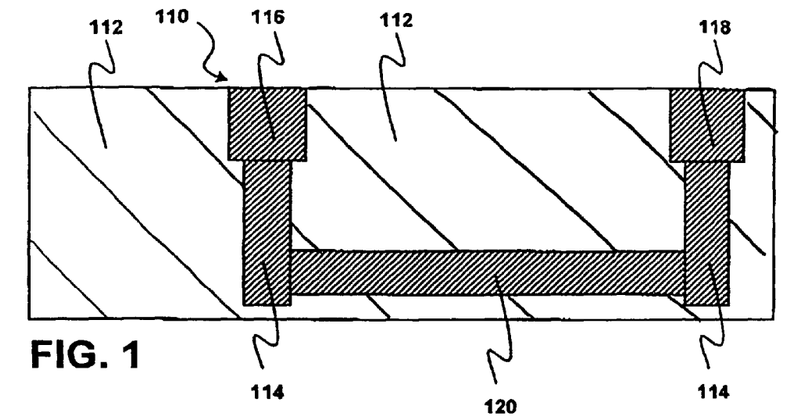
FIG. 1 is an elevational cross-section of a semiconductor structure that is being fabricated into an inventive bipolar junction transistor (BJT) according to an embodiment of the present invention.

FIG. 1 illustrates the beginnings of a process flow according to an embodiment. The precursor of a bipolar junction transistor 110 is fabricated from a substrate 112, that includes deep trench isolation (DTI) structures 114. Shallow trench isolation (STI) structures include a collector-proximate or first STI 116 that is spaced apart from a base-proximate or second STI 118. In an alternative embodiment, an N-buried layer 120 is embedded in substrate 112 where BJT 110 is an NPN structure. Further, depending upon the configuration of NPN or PNP, the buried layer 120 may be selected from a P−− buried layer, a P− buried layer, a P buried layer, a P+ buried layer, a P++ buried layer, an N−− buried layer, an N− buried layer, an N buried layer, an N+ buried layer, and an N++ buried layer. In another embodiment, there is no buried layer 120.

Figure 2:
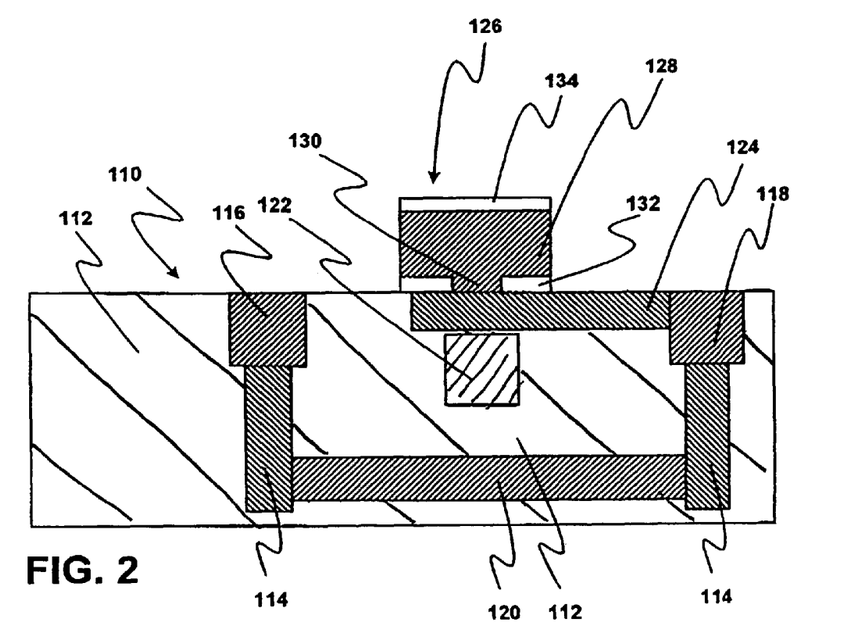
FIG. 2 is an elevational cross-section of the semiconductor structure depicted in FIG. 1 after further processing.

FIG. 2 illustrates further processing. A collector structure 122 is formed in substrate 112 by ion implantation, and an epitaxial base layer 124 is formed in substrate 112. In one embodiment, epitaxial base layer 124 is formed by a dry anisotropic etch into substrate 112 to form a trench, followed by epitaxial growth in the trench of a material such as monocrystalline silicon from a source such as silane. The formation of epitaxial base layer 124 such as an epitaxial monocrystalline silicon layer is carried out according to process flows and conditions known in the art. Epitaxial base layer 124 may be carried out by a chemical vapor deposition (CVD) process flow selected from low-pressure CVD (LPCVD), reactive-plasma CVD (RCVD), plasma-enhanced CVD (PECVD), and combinations thereof as known in the art. By way of one non-limiting example, the CVD process flow may be carried out in a pressure range from about $10^{-2}$ Torr, to about $2 \times 10^{-1}$ Torr. The CVD gas may be supplied as a silane type gas or a doped silane type gas.

Thereafter, an emitter stack 126 is formed that includes emitter polysilicon 128, an emitter cut 130 and an interlayer dielectric (ILD) layer 132. In one embodiment, an oxide layer is formed over substrate 112 and epitaxial base layer 124, and patterning is done in the oxide layer to configure ILD layer 132 and to form emitter cut 130 therein. As a result, emitter cut 130 will facilitate formation of an intrinsic base as set forth herein. In one embodiment, the formation of emitter stack 126 is carried out after a hard mask 134 is patterned above emitter polysilicon 128. Etching is done with hard mask 134 such that the polysilicon film is patterned into emitter polysilicon 128.

Hard mask 134 is a material that will etch in an etch recipe that is selective to substrate 112 and epitaxial base layer 124. For example, hard mask 134 is a nitride layer such as a silicon nitride (such as stoichiometric $Si_3N_4$ or the like or an $Si_xN_y$, non-stoichiometric solid solution). In another embodiment, hard mask 134 is a metal nitride layer such as a refractory metal nitride. In one embodiment, the metal nitride layer is tungsten nitride. In one embodiment, the metal nitride layer is titanium nitride. In one embodiment, hard mask 134 is selected from titanium nitride, aluminum nitride, titanium-aluminum nitride, and the like.

In one embodiment, hard mask 134 is an oxide layer such as silicon oxide. The hard mask 134, when it is an oxide layer, may be a thermal oxide, a deposited oxide, or a combination thereof. In various embodiments, the oxides are selected from silica, titania, ceria, thoria, alumina, zirconia, hafnia, and the like.

In another embodiment, hard mask 134 is an oxynitride layer such as silicon oxynitride. Other oxynitride embodiments include oxynitrides of silicon, titanium, cerium, thorium, aluminum, zirconium, hafnium, and the like. Oxynitride layers may be formed by thermal growth, metal oxide deposition, followed by nitridation, and the like.

In another embodiment, the hard mask 134 is a material that integrates to a nitride or oxide layer that is also formed in other regions over substrate 112. For example, several of the embodiments set forth in this disclosure may be used with a bipolar-complementary metal oxide semiconductor (BiC-MOS) process flow. Accordingly, the layer comprising hard mask 134 may be utilized as protective layers over a CMOS region (not depicted) of substrate 112 during the forming of various structures between first STI 116 and second STI 118.

In one embodiment, doping of emitter polysilicon 128 is carried out once, and the presence of hard mask 134 is useful in protecting emitter polysilicon 128 from any subsequent doping or implanting process flows. For example, an emitter polysilicon film is blanket deposited and in situ doped above substrate 112. Thereafter, a hard mask material is blanket deposited, and hard mask 134 and emitter stack 126 are patterned, either simultaneously or sequentially.

Figure 3:
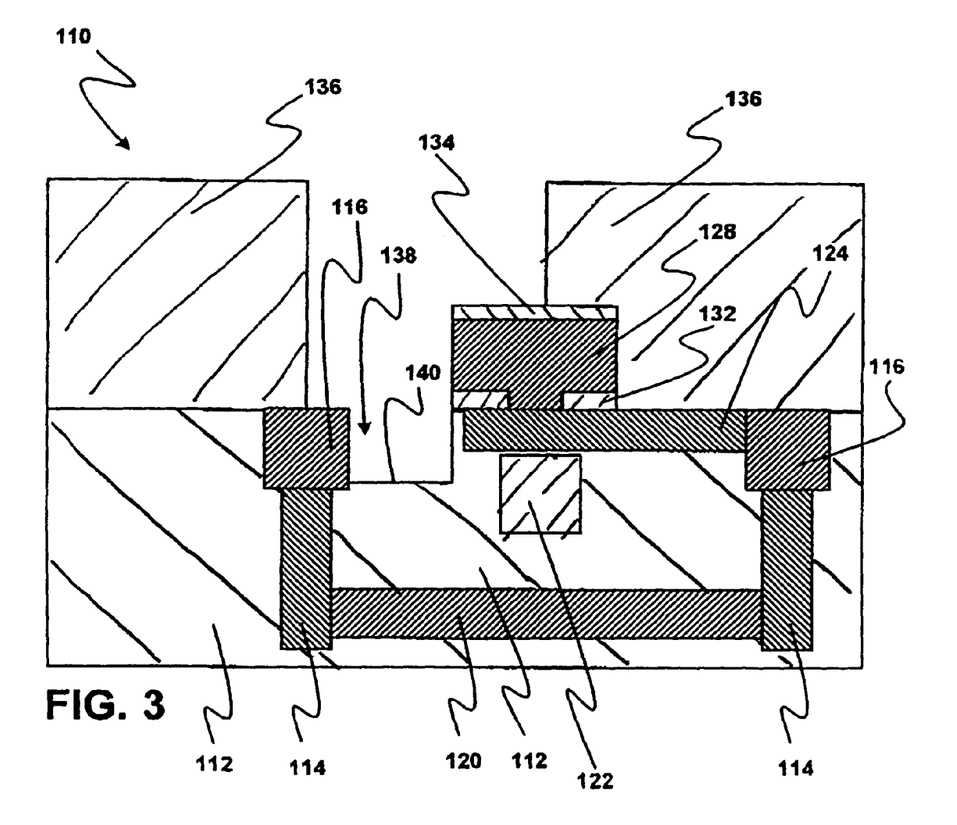
FIG. 3 is an elevational cross-section of the semiconductor structure depicted in FIG. 2 after further processing.

FIG. 3 illustrates further processing in which a mask 136 is patterned in order to create a self-aligned recess 138. Mask 136 is patterned in order to expose at least a part of first STI 116 and also at least a portion of hard mask 134. Thereby, first STI 116 and hard mask 134 act to create a self-aligned exposure of a portion of substrate 112. In one embodiment, mask 136 is a photoresist material that is spun on, cured, and patterned. Etching is carried out through mask 136 between the emitter polysilicon 128 and first STI 116 to form a self-aligned recess 138 in substrate 112, that stops at a level into substrate 112 to form a recess floor 140. Hard mask 134 acts as a self-aligning agent on one edge of the self-aligned recess 138. In one embodiment, the level to which recess floor 140 cuts into substrate 112 substantially eliminates the equivalent resistance of third resistivity path 40 (FIG. 9) that would otherwise be present in BJT 110. Further, because BJT 110 is fabricated in the absence of a center- or emitter-proximate STI (FIG. 9) where emitter stack 126 share a boundary with recess 138, the equivalent resistance of second resistivity path 38 (FIG. 9) is also substantially eliminated in BJT 110.

Figure 4:
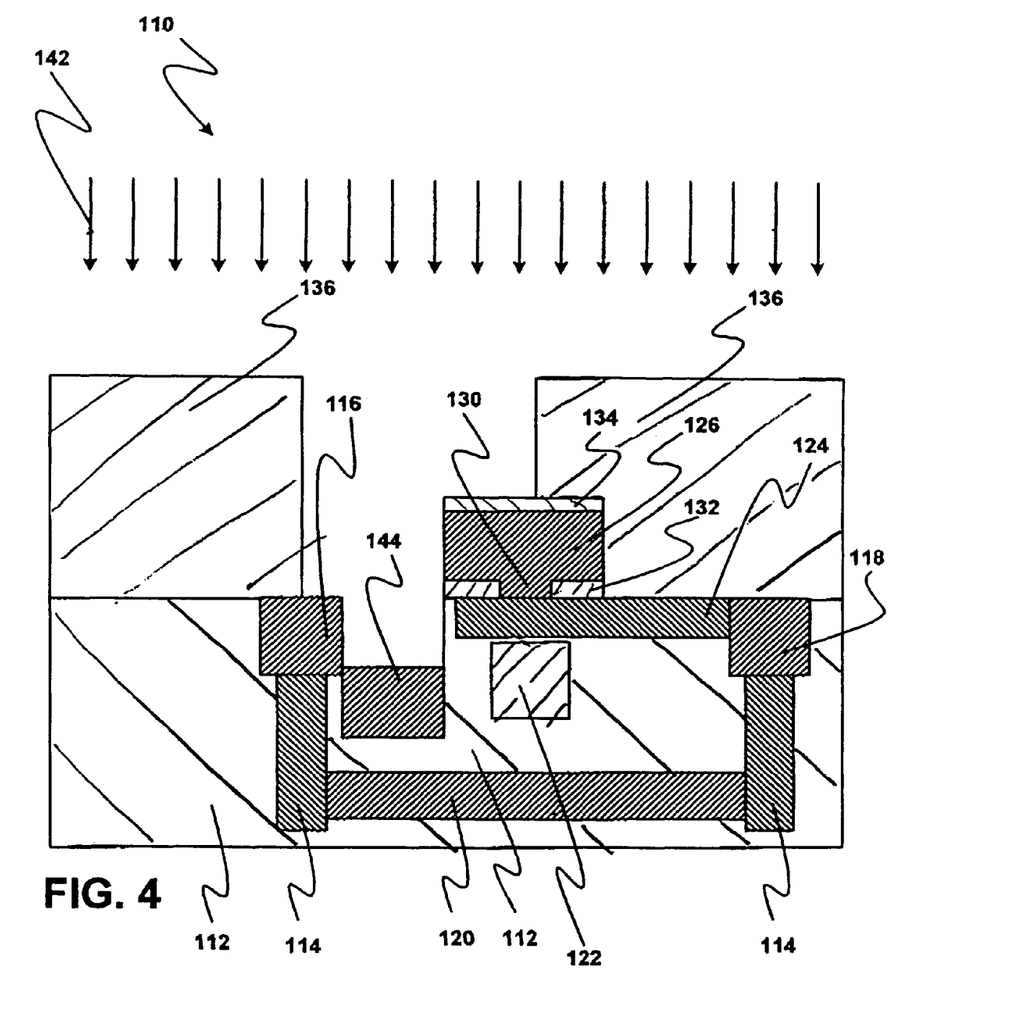
FIG. 4 is an elevational cross-section of the semiconductor structure depicted in FIG. 3 after further processing.

FIG. 4 illustrates further processing. After the formation of self-aligned recess 138 (FIG. 3), a self-aligned implanting 142 is carried out. Mask 136, first STI 116, and hard mask 134 further act as masking during self-aligned implanting 142. Accordingly, a self-aligned collector tap 144 is formed in substrate 112. In one embodiment, both etching of self-aligned recess 138 and implanting of self-alined collector tap 144 are done without changing masking. In one embodiment, the self-aligned etching and the self-aligned implanting 142 are done in a single tool that is first used for an etch such as a sputter etch or a reactive ion etching (RIE), followed by an implanting.

Where BJT 110 is an NPN transistor, self-aligned collector tap 144 (also referred to as an N source/drain (NSD) ) is N-implanted. In other embodiments, depending upon whether BJT 110 is an NPN or a PNP transistor, self-aligned collector tap 144 is selected from P−− collector tap, a P− collector tap, a P collector tap, a P+ collector tap, a P++ collector tap, an N−− collector tap, an N− collector tap, an N collector tap, an N+ collector tap, and an N++ collector tap. In another embodiment, collector tap 144 has no doping that is different from that of substrate 112.

Figure 5:
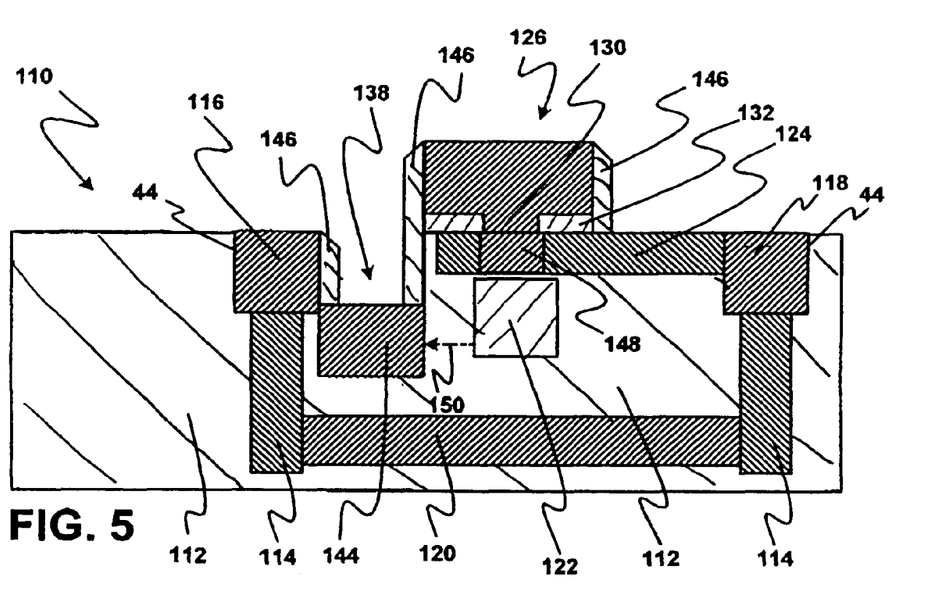
FIG. 5 is an elevational cross-section of the semiconductor structure depicted in FIG. 4 after further processing.

FIG. 5 illustrates further processing. Hard mask 134 (FIG. 4) is removed by a wet etch that is selective to the emitter polysilicon 128, to epitaxial layer 124, and to self-aligned collector tap 144. Thereafter, a spacer layer is deposited and spacer etched to form a spacer 146. Spacer 146 extends into recess 138, both on one side of emitter stack 126 and on one side of first STI 116.

Spacer 146 acts to protect and isolate substrate 112 and emitter stack 126 during further processing. In one embodiment, spacer 146 is a CMOS composite such as an oxide-nitride layer wherein the oxide layer is deposited first and the nitride layer is deposited second, or visa versa. In another embodiment, spacer 146 is a first nitride layer and a second oxide layer. In another embodiment, spacer 146 is a first oxide layer and a second oxide layer, wherein the first and second oxide layers exhibit different reactivities to etching and oxidation. In another embodiment, spacer 146 is a first nitride layer and a second nitride layer, wherein the first and second nitride layers exhibit different reactivities to etching and oxidation.

In one exemplary embodiment, after forming of the spacer layer, spacer etching is carried out with an anisotropic dry etching to form spacer 146. The anisotropic dry etching is a reactive ion etch (RIE), followed by an alternative wet clean as is known in the art. The spacer layer may be selected to be either oxide, nitride, oxide-nitride, nitride-oxide, oxide-oxide, nitride-nitride, or otherwise according to a specific process integration. For example, where BJT 110 is part of a logic structure, fabrication of an embedded memory array elsewhere on the substrate may call for a nitride layer and an oxide layer. In this example, the spacer layer may be the same layer that acts to cover the embedded memory array during processing of the BJT 110.

Further processing is carried out to form an intrinsic base region 148 in epitaxial base layer 124. In one embodiment, thermal processing is used to form intrinsic base region 148. Other processing is carried out such as the formation of a bulk interlayer dielectric (ILD) layer (not depicted) over BJT 110 and contact holes (not depicted) that open to epitaxial base layer 124, to emitter stack 126, and to self-alined collector tap 144.

One embodiment of the present invention relates to the removal of significant resistivity pathways that existed in the prior art. Consequently, according to an embodiment, resistivity in BJT 110 is lower that a previous BJT. Further, current flow through substrate 112 between the collector structure 122 and the collector tap 144 is a horizontal resistivity path 150 that is substantially monodirectional although current flow moves through 3-dimensional solid space. Further, self-aligned recess 138 acts as a contact corridor for a metal contact (not pictured) that may include a tungsten plug, a titanium-lined recess for a metal plug, and the like.

Figure 6:
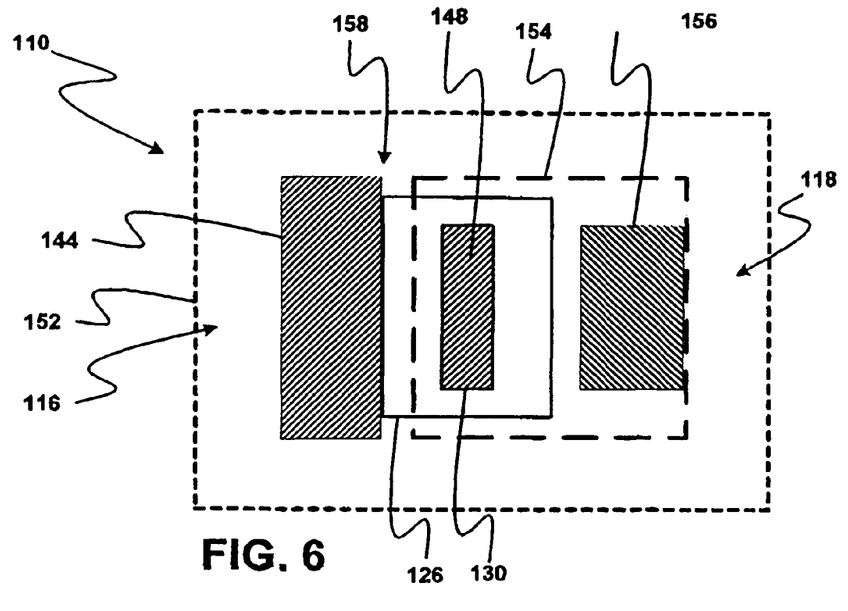
FIG. 6 is a plan view of one embodiment of a BJT layout wherein the perimeters of various structures are depicted.

FIG. 6 is a top layout schematic view depicting selected structures of BJT 110 according to an embodiment. FIG. 6 illustrates projections of the perimeters of various structures. A BJT perimeter 152 measures the BJT 110 from the outer edges 44 of first STI 116 and second STI 118. In one embodiment, first STI 116 and second STI 118 are part of a guard ring that is delineated by BJT perimeter 152. An exptaxial base layer perimeter 154 is also depicted. Emitter stack 126 is depicted by its perimeter, and intrinsic base region 148 is also depicted by its perimeter as it forms substantially below the emitter cut 130. It is noted that the emitter stack perimeter 126 and the epitaxial base layer perimeter 154 intersect.

Other selected structures include the perimeter of collector tap 144 and a base tap 156 perimeter portion of epitaxial base layer 124 that may or may not be additionally doped.

FIG. 6 illustrates selected structures of a BJT embodiment that is more compact that previous BJT structures. It is notable that collector tap 144 shares a substantially co-linear first boundary 158 with emitter stack 126 as accomplished by the self-aligned etch and optional implanting facilitated by hard mask 134 (FIG. 4).

In one embodiment it is also notable that horizontal resistivity path 150, depicted in FIG. 5, is not encumbered by a middle STI such as in the prior art depicted in FIG. 9. Although horizontal resistivity path 150 is depicted by a dashed line, it is understood that a given current flow path between collector structure 122 and collector tap 144 is substantially in a single direction.

In one embodiment, horizontal resistivity path 150 represents a range from about 300 ohm·cm$^{-2}$ to about 700 ohm·cm$^{-2}$. In other words, the amount of total impedance that is experienced is greater than about 80% in substantially in a single direction that is approximated by horizontal resistivity path 150. In another embodiment, the amount of total impedance that is experienced is greater than about 90% in substantially in a single direction that is approximated by horizontal resistivity path 150. In another embodiment, the amount of total impedance that is experienced is greater than about 99% in substantially in a single direction that is approximated by horizontal resistivity path 150.

Figure 7:
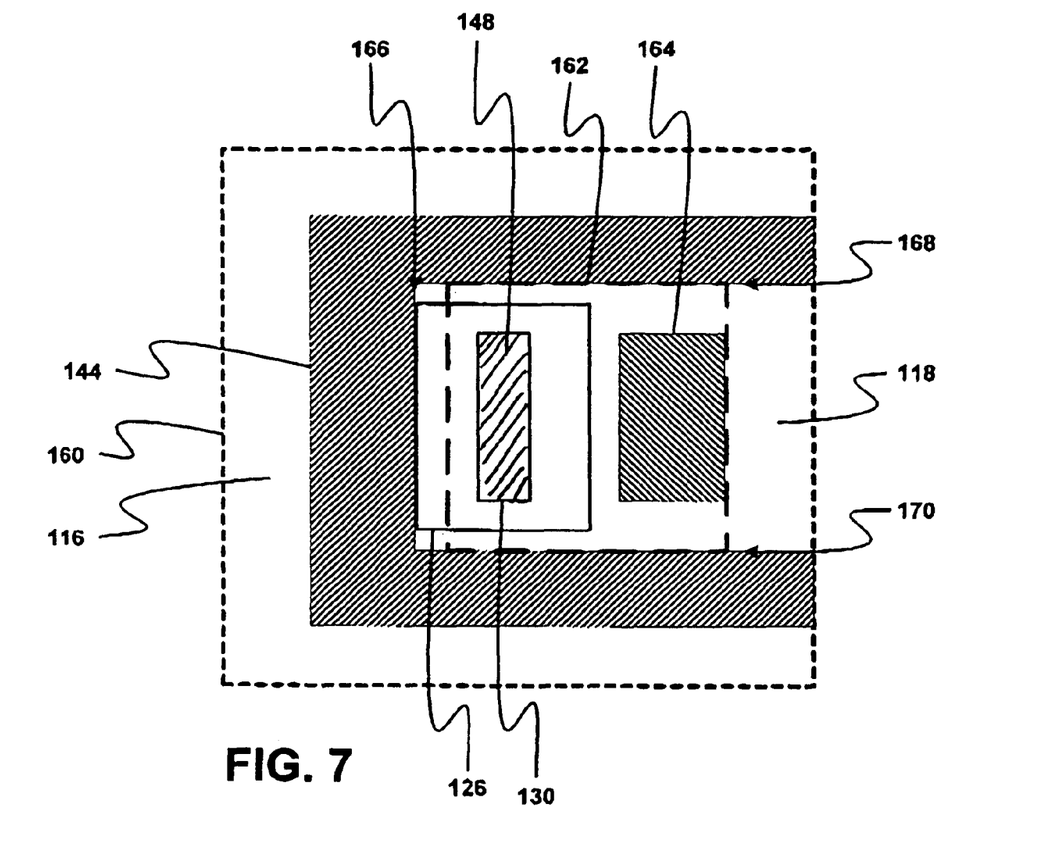
FIG. 7 is a plan view of one embodiment of a BJT layout wherein the perimeters of various structures are depicted.

In one embodiment a current flow path scheme is selected that allows for higher and shorter current flow between the collector structure 122 and collector tap 144 as depicted in FIG. 5. FIG. 7 is a top layout schematic view depicting selected structures of BJT 110 according to an embodiment that may also be described in cross-section by FIG. 5. A BJT perimeter 160 measures the BJT 110 from outer edges 44 (FIG. 5) of first STI 116 and second STI 118. In one embodiment, first STI 116 is a U-shaped guard structure that is enclosed by BJT perimeter 160. Second STI 118 comprises an elongate, substantially linearly symmetrical structure that is also enclosed by BJT perimeter 160. An exptaxial base layer perimeter 162 is also depicted. Emitter stack 126 is depicted by its perimeter, and intrinsic base region 148 is also depicted by its perimeter as it forms substantially below the emitter cut 130 (FIG. 5). Other selected structures include collector tap 144 and a base tap 164 portion of epitaxial base layer 124 (FIG. 5) that may or may not be additionally doped. In this embodiment, collector tap 144 is laid out as a U-shaped structure that allows for current flow in three general but substantially co-planar directions between the collector structure 122 (FIG. 5) and collector tap 144.

FIG. 7 illustrates selected structures of a BJT embodiment that is more compact than prior art BJT structures. It is notable that collector tap 144 shares a substantially co-linear first boundary 166 with emitter structure 126 as accomplished by the self-aligned etch and implanting facilitated by hard mask 134 (FIG. 4). However, collector tap 144 and emitter structure 126 are not substantially co-planar as viewed in elevational cross section in FIG. 5.

It is also notable that collector tap 144 shares a substantially co-linear second boundary 168 with epitaxial base layer perimeter 162, as well as a substantially co-linear third boundary 170 with epitaxial base layer perimeter 162. It is also noted that second boundary 168 and third boundary 170 are parallel with each other.

In one embodiment it is also notable that horizontal resistivity path 150, depicted in FIG. 5, is shorter than horizontal second resistivity path 38, depicted in FIG. 9. However, because of the U-shape of collector tap 144, current flows in three substantially coplanar directions. In one embodiment, horizontal resistivity path 150 represents a range from about 300 ohm·cm$^{-2}$ to about 700 ohm·cm$^{-2}$. The amount of total impedance that is experienced in these directions is greater than about 90% of the total. In another embodiment, current flows in three substantially coplanar directions and the amount of total impedance that is experienced in these directions is greater than about 99% of the total directional current flow. In another embodiment, current flows in the three substantially coplanar directions and the amount of total impedance that is experienced in these directions is greater than about 99.9%. In each selected embodiment, the current flow paths cross at least one of first boundary 166, second boundary 168, and third boundary 170.

Figure 8:
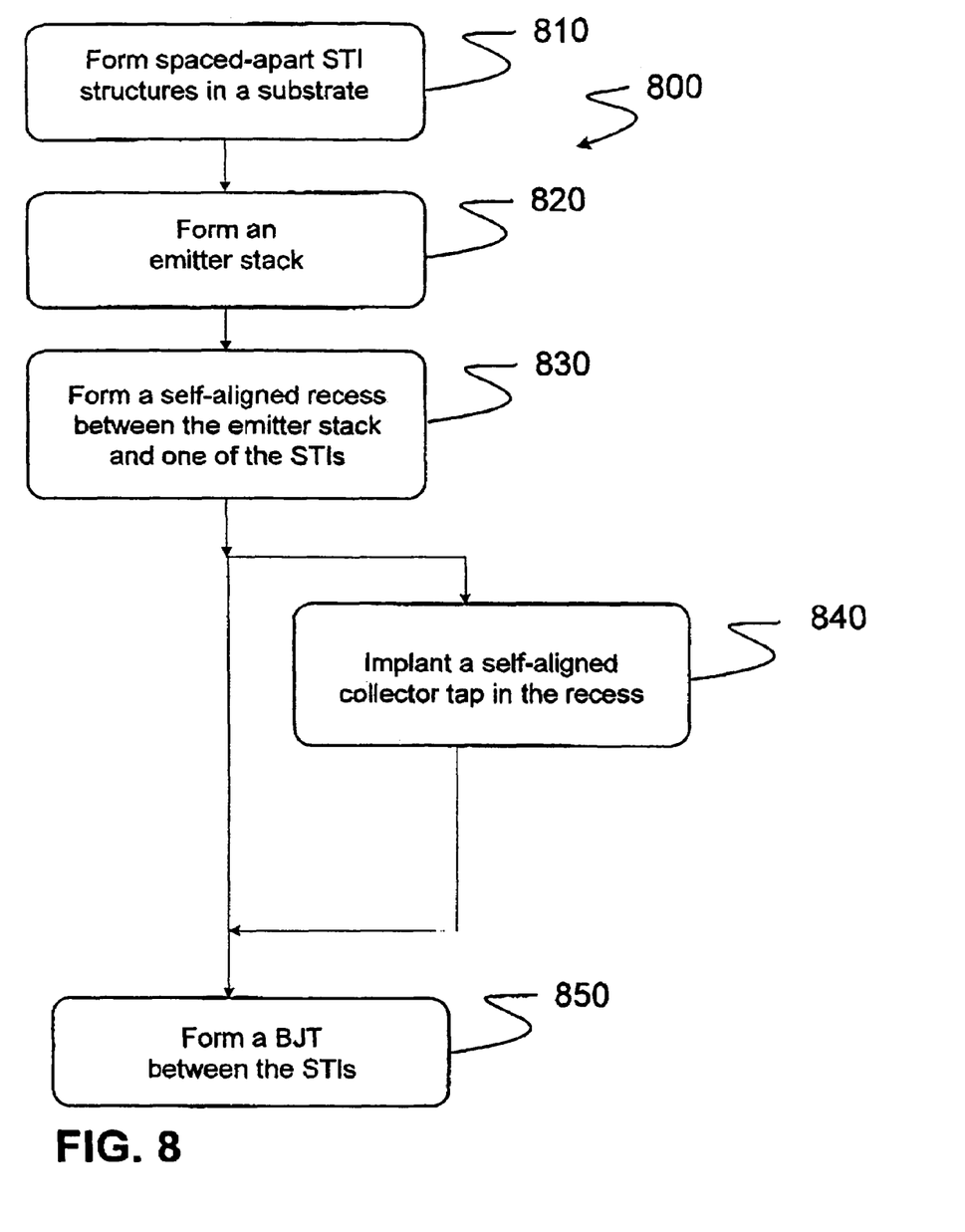
FIG. 8 is a flow chart that describes an inventive process flow according to an embodiment of the present invention.

FIG. 8 is a process flow diagram 800 that illustrates one embodiment of the present invention. In one embodiment, the inventive process commences with forming 810 spaced-apart first- and a second isolation structures in a substrate. The process continues by forming elements of a bipolar junction transistor between the first and second isolation structures. The process includes forming 820 an emitter stack between the first and second isolation structures. Next, the process flow forms 830 a self-aligned recess in the substrate between the emitter and the first isolation structure. Thereafter, optional implanting 840 of a self-aligned collector tap is accomplished in the self-aligned recess. The process continues by completing 850 a bipolar junction transistor between the first and second isolation structures.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A bipolar junction transistor comprising:
   in a substrate, a first isolation structure spaced apart from a second isolation structure;
   an epitaxial base layer formed in the substrate;
   an emitter stack disposed immediately above the epitaxial base layer above the substrate and between the first isolation structure and the second isolation structure, wherein the emitter stack has an emitter stack perimeter;
   a recess disposed immediately adjacent to the emitter stack and disposed between the emitter stack and the first isolation structure, wherein the recess exposes a collector tap having a collector tap perimeter, wherein the emitter stack and the recess share a boundary, and wherein the emitter stack perimeter and the collector tap perimeter share a co-linear boundary;
   an emitter cut provided at the bottom of said emitter stack and immediately or top of an intrinsic base structure formed in epitaxial base layer of the substrate; and
   a collector structure disposed in the substrate below the emitter stack, wherein the collector structure is coupled to the collector tap through the substrate.

2. The bipolar junction transistor according to claim 1, further including:
   a buried layer disposed in the substrate between the first isolation structure and the second isolation structure.

3. The bipolar junction transistor according to claim 1, further including:
   a collector structure disposed in the substrate below the emitter stack;
   wherein the intrinsic base structure is disposed between the emitter stack and the collector structure.

4. The bipolar junction transistor according to claim 1, further including:
   a dielectric layer disposed above the substrate and below the emitter stack; wherein the dielectric layer is patterned for said emitter cut to be formed therein and above the collector structure; and
   wherein the intrinsic base structure is disposed between the emitter cut and the collector structure.

5. The bipolar junction transistor according to claim 1, further including: in the substrate, a collector tap disposed in the recess, wherein the collector tap is selected from a P-- collector tap, a P- collector tap, a P collector tap, a P+ collector tap, a P++ collector tap, an N-- collector tap, an N- collector tap, an N collector tap, an N+ collector tap, and an N++ collector tap.

6. The bipolar junction transistor according to claim 1, wherein the substrate includes a bipolar-complementary metal oxide semiconductor (BiCMOS) structure.

7. The bipolar junction transistor according to claim 1, wherein the BJT is selected from a monojunction BJT device and a heterojunction BJT device.

8. The bipolar junction transistor according to claim 1, wherein the collector tap is self-aligned.

9. The bipolar junction transistor according to claim 1, wherein the bipolar junction transistor is an NPN transistor, and wherein the collector tap is selected from an N-- collector tap, an N- collector tap, an N collector tap, an N+ collector tap, and an N++ collector tap.

10. The bipolar junction transistor according to claim 1, wherein the bipolar junction transistor is a PNP transistor, and wherein the collector tap is selected from a P-- collector tap, a P- collector tap, a P collector tap, a P+ collector tap, and a P++ collector tap.

11. The bipolar junction transistor according to claim 1, wherein the collector tap has no doping that is different from the substrate.

12. The bipolar junction transistor according to claim 1, wherein the recess is a contact corridor.

* * * * *